United States Patent
Chern et al.

(10) Patent No.: US 6,238,974 B1
(45) Date of Patent: May 29, 2001

(54) METHOD OF FORMING DRAM CAPACITORS WITH A NATIVE OXIDE ETCH-STOP

(75) Inventors: Horng-Nan Chern, Tainan Hsien; Kevin Lin, Taipei Hsien; Kun-Chi Lin, Hsinchu, all of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/475,212

(22) Filed: Dec. 29, 1999

Related U.S. Application Data

(63) Continuation-in-part of application No. 09/010,176, filed on Jan. 21, 1998.

(30) Foreign Application Priority Data

Nov. 8, 1997 (TW) ................................................ 86116672

(51) Int. Cl.⁷ ........................ H01L 21/8242; H01L 21/20
(52) U.S. Cl. ........................................... 438/255; 438/398
(58) Field of Search .................................... 438/239, 243, 438/244, 253, 255, 396, 398, 238

(56) References Cited

U.S. PATENT DOCUMENTS

| | | | |
|---|---|---|---|
| 5,486,488 | * | 1/1996 | Kamiyama . |
| 5,608,247 | * | 3/1997 | Brown . |
| 5,658,818 | * | 8/1997 | Akram et al. ........................... 437/60 |
| 5,811,344 | * | 9/1998 | Tu et al. ............................... 438/396 |
| 5,817,555 | * | 10/1998 | Cho ...................................... 438/253 |
| 5,849,624 | * | 12/1998 | Fazan et al. .......................... 438/398 |
| 5,856,007 | * | 1/1999 | Sharan et al. . |
| 5,877,052 | * | 3/1999 | Lin et al. . |
| 5,893,980 | * | 4/1999 | Cho . |
| 5,902,124 | * | 5/1999 | Hong . |
| 5,926,711 | * | 7/1999 | Woo et al. . |
| 5,930,625 | * | 7/1999 | Lin et al. . |
| 5,940,676 | * | 8/1999 | Fazan et al. ............................. 438/3 |
| 5,953,608 | * | 9/1999 | Hirota . |
| 5,970,360 | * | 10/1999 | Cheng et al. . |
| 6,046,084 | * | 4/2000 | Wei et al. . |
| 6,066,529 | * | 5/2000 | Lin et al. . |
| 6,071,774 | * | 6/2000 | Sung et al. . |
| 6,080,623 | * | 6/2000 | Ono . |
| 6,127,221 | * | 10/2000 | Lin et al. . |
| 6,143,620 | * | 11/2000 | Sharan et al. . |
| 6,153,465 | * | 11/2000 | Jenq et al. . |
| 6,153,466 | * | 11/2000 | Yew et al. . |

FOREIGN PATENT DOCUMENTS

| | | | | |
|---|---|---|---|---|
| 09167833 | * | 6/1997 | (JP) | ........................................ 21/28 |
| 319903 | * | 11/1997 | (TW) . | |
| WO 99/04434 | * | 7/1997 | (WO) . | |

OTHER PUBLICATIONS

S. Wolf and R.N. Tauber, Silicon Processing for the VLSI Era, vol. 1—Process Technology, p. 520, 1986.*

* cited by examiner

Primary Examiner—Charles Bowers
Assistant Examiner—Evan Pert
(74) Attorney, Agent, or Firm—Rabin & Champagne PC

(57) ABSTRACT

A process of fabricating a bottom electrode for the storage capacitors of DRAM is disclosed. The process includes first forming an insulation layer on the surface of the device substrate, with the insulation layer patterned to form a contact opening that exposes a source/drain region of the memory cell transistor. A first conductive layer then covers the insulation layer and fills into the contact opening, with the first conductive layer contacting the exposed source/drain region. A native oxide layer is then formed on the surface of the first conductive layer. A second electrically conductive layer is then formed and patterned to form a recess substantially above the location of the contact opening in the insulation layer. A layer of HSG—Si then covers the surface of the second conductive layer and the surface of the recess, and the HSG—Si layer and the second conductive layer are patterned to form the bottom electrode of the capacitor. The recess and its covering HSG—Si layer increase the effective surface area of the bottom electrode of the capacitor.

9 Claims, 2 Drawing Sheets

METHOD OF FORMING DRAM CAPACITORS WITH A NATIVE OXIDE ETCH-STOP

CROSS-REFERENCE TO RELATED APPLICATION

This is a Continuation-in-Part application of Ser. No. 09/010,176, filed Jan. 21, 1998.

BACKGROUND OF THE INVENTION

1. Field of the Invention

This invention relates in general to a process of making semiconductor integrated circuit devices and, in particular, to a process of fabricating a semiconductor IC structure for storage of electrical charges. More particularly, this invention relates to a process of fabricating the bottom electrode for a charge storage capacitor for memory IC devices.

2. Description of Related Art

Charged and discharged status of capacitors are used as the basis for the storage of information bits in memory cells of semiconductor DRAM devices. For example, in a particular circuit design, the charged capacitor of a DRAM memory cell may be used to represent a binary data bit of 0, while its discharged status represents 1. Of course the reverse scheme is also allowable.

Capacitance or, in other words, the amount of electric charges held in a capacitor is determined by several factors. These include the surface area of the capacitor electrodes, the electrical isolation between the electrodes, as well as the dielectric constant of the capacitor dielectric material embedded between the electrodes.

To access the information storage content of a particular memory cell of a DRAM device, a field-effect transistor (FET) known as transfer FET is used to couple the target capacitor in the cell to the proper bit line of the memory cell array. The coupling allows the electrical charges to be sensed by transferring to the related circuitry of the supporting logic. In this process, the particular memory array bit line is electrically connected to one of the source/drain terminals of the transfer FET, while one electrode of the cell capacitor is connected to the other of the source/drain terminals of the transfer FET. The corresponding word line for this access is then connected to the gate terminal of the transfer FET. A timely issued gating signal sent via the word line allows the charges accumulated in the capacitor to be transferred for sensing via this established circuit path using the transfer FET as the switching device connecting the capacitor to the supporting logic.

integration densities of IC devices are constantly increased for increasing IC performance. In the case of DRAMs, increasing circuit density increases storage capacity. In general, the ability to pack more memory cells in one single IC chip also helps in reducing the per-bit costs of these semiconductor memory devices, especially when compared with implementing the same amount of memory capacity over a multiple number of IC devices.

Several practices can result in the improvement of IC device integration density. These include the reduction of the size of wiring lines in the circuitry, the size of gate terminal of transistors, as well as the isolation regions reserved between circuit elements. These dimensional reductions are dependent on the improvement over the resolution of design rules for implementing IC devices.

Planarity of IC devices contradicts the requirement that capacitor capacitance of DRAM memory cell units be maintained at an acceptable level while reduction of design rule resolution reduction is also implemented. Insufficient capacitance of memory cell capacitors generates a series of problems for DRAM devices. Due to the inherent nature of capacitors implemented in normal DRAM memory cells, electric charges accumulated in the capacitors leak inevitably as time prolongs. Thus, excessive leakage currents lead to the requirement of higher refresh frequency in DRAM operation. Higher memory cell refresh frequencies, however, consumes directly into the DRAM duty cycle for memory access operation.

On the other hand, a memory cell storage capacitor having an electric voltage across the electrodes decaying at a faster rate due to larger leakage current would place more demands on the charge-sensing amplifier in the memory access circuitry of the device. In other words, the charge sense amplifier must be equipped with a better sensitivity in order to accurately sense and judge the high- or low-status of the voltage of the capacitor.

Thus, as DRAM devices are being manufactured with ever higher fabrication resolutions, various efforts are being employed to increase the storage cell capacitor capacitance. Complex capacitor configurations such as three-dimensional electrode structures are used to increase the electrode surface area in order for the capacitor to hold more electric charges within the same physical three-dimensional space. However, these complex three-dimensional structures are difficult to fabricate, and it will become even more difficult as the memory cells get smaller in size.

Forming hemispherical-grain polysilicon (HSG—Si) over the surface of the electrodes of the storage capacitor is one development recently employed for increasing the capacitor capacitance. Conventional DRAM storage capacitors have traditional planarized polysilicon forming the electrodes. These storage capacitors have basically a flat bottom electrode surface. HSG—Si is a special form of polysilicon exhibiting a coarse surface. When deposited over the surface of the bottom electrode of storage capacitors with a properly controlled procedure, the HSG—Si is capable of effectively increasing the surface area of the capacitor bottom electrode. An increase of roughly 1.8 times the capacitance had been achieved by such an HSG—Si deposition.

However, if an even larger increase of electrode surface area in addition to this simple HSG—Si deposition is desired, three-dimensional surface contours such as pillars, fins, cavities, recesses or similar structural configurations must be formed over the surface of the electrode before the HSG—Si deposition.

SUMMARY OF THE INVENTION

It is therefore an object of the invention to provide a process of fabricating bottom electrode for memory cell capacitor of DRAM devices having greatly increased electrode surface area by providing a generally curved electrode surface in combination with a coarse surface characteristic.

The invention achieves the above-identified object by providing a process of fabricating a structure for storing electrical charges for the bottom electrode in a storage capacitor of the memory cells in a DRAM device. The process includes the steps of forming an insulation layer on the surface of the substrate of the device, and the insulation layer is patterned to form a contact opening exposing a source/drain region of the transistor of the memory cell. A first electrically conductive layer is formed covering the insulation layer and further filling, into the contact opening, with the first electrically conductive layer contacting the exposed source/drain region. A native oxide layer is then formed on the surface of the first electrically conductive layer. A second electrically conductive layer is then formed, and is patterned to form a recess substantially located above the location of the contact opening, formed in the insulation layer. A layer of HSG—Si is formed over the surface of the second electrically conductive layer and the surface of the recess, and the HSG—Si layer and the second electrically conductive layer are subsequently patterned to form the bottom electrode of the capacitor.

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which.

DESCRIPTION OF THE PREFERRED EMBODIMENT

Figure 1:
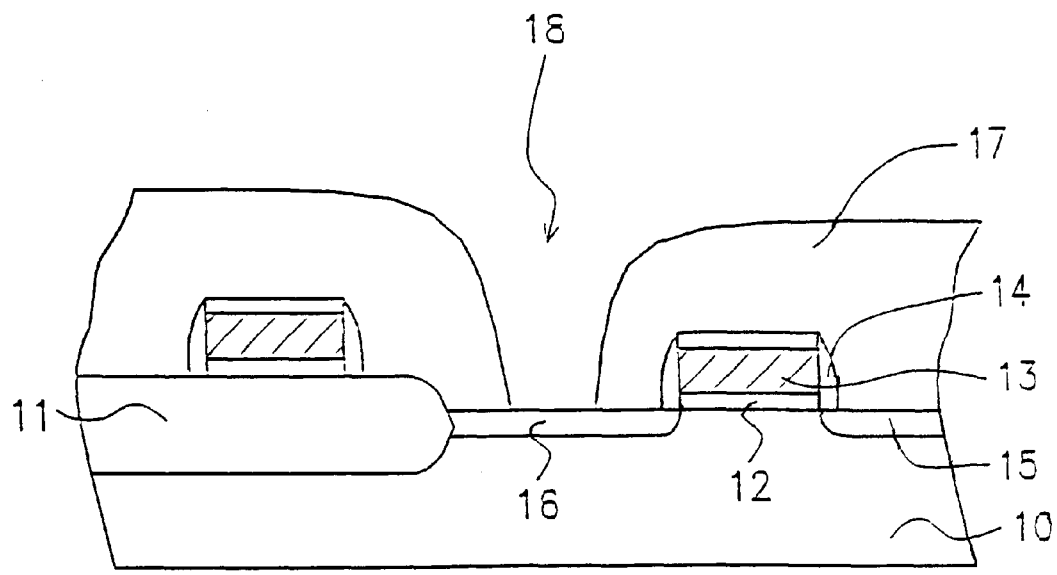
FIGS. 1 through 4 are cross-sectional views depicting a process for fabricating the storage capacitor structure in accordance with a preferred embodiment of the invention.

Refer to FIG. 1 of the drawing. In the process of fabricating a memory cell storage capacitor for a DRAM device, a silicon substrate 10 is processed in a thermal oxidation procedure, for example a local oxidation of silicon (LOCOS), in order to form a field oxide region 11. The field oxide 11 has a thickness of about 3,000 Å. Then, the substrate 10 is subject to another thermal oxidation procedure, forming a gate oxide 12, with a thickness of about 150 Å. A chemical vapor deposition (CVD) or low-pressure CVD (LPCVD) then follows to form a layer of polysilicon 13 over the surface of the gate oxide 12 with a thickness of about 2,000 Å. To improve electrical conductivity of this polysilicon layer 13, ions such as phosphorus ions can be implanted. Then, a photolithographic procedure can be employed to form patterns in the polysilicon layer 13 in order to form a gate electrode for the transistor of the memory device. An oxide layer is then deposited which is further etched back to form protective sidewalls 14 for the structure. An ion implantation procedure employing ions such as boron ions then performed to implant impurities into the substrate, so as to form source/drain regions 15 and 16. In this implantation procedure, the gate structure is utilized as the masking, and the dosage of implantation is about $1E1^{15}$ atoms/cm$^2$, and the implantation energy is at a level of about 70 keV.

Then, as is illustrated in the drawing, an insulation layer 17 with a contact opening 18 is further formed covering the devices substrate at this stage. This insulation layer 17 can be formed in, for example, a CVD procedure and has a thickness of about 2,000–4,000 Å. The contact opening 18 may be formed to expose one of the transistor source/drain regions 15 or 16 in, for example, a dry etching procedure that consumes into the insulation layer 17.

Figure 2:
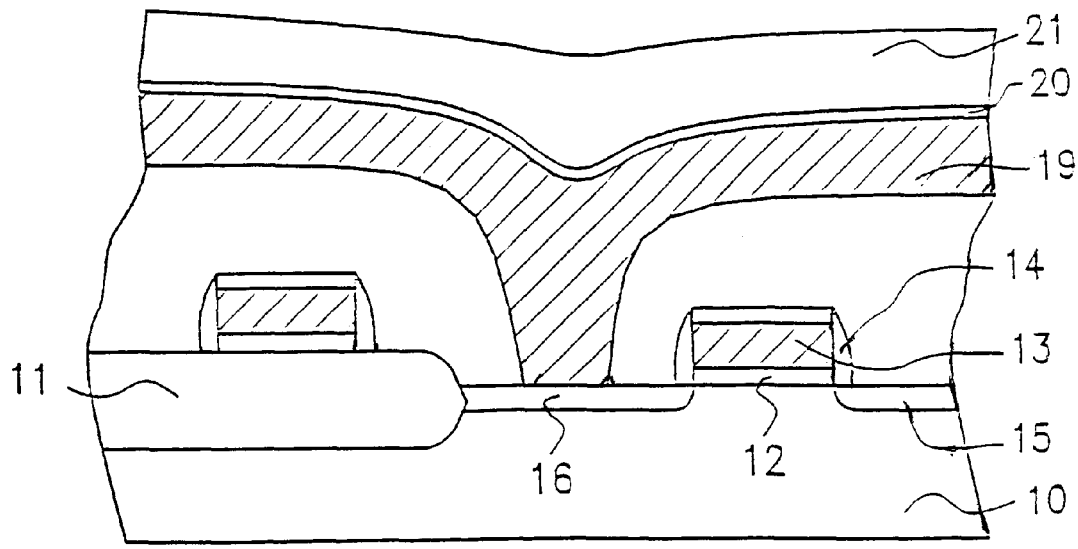

Refer to FIG. 2. The surface of the entire device substrate is now covered by an electrically conductive layer 19. This conductive layer may be, for example, an impurity-doped polysilicon layer that fills into the opening 18 and forms electrical contact with the exposed source/drain 15 or 16 of the device. The polysilicon conductive layer 19 is left exposed in an atmosphere containing oxygen, and a native oxide layer in the form of a thin film of oxide layer 20 is produced. The native oxide layer 20 can be formed by growing an oxide using $N_2/O_2$ annealing, for example. This will allow the layer 20 to be grown to a thickness sufficient to be utilized as an etch stop layer. Over the surface of this native oxide layer 20, another electrically-conductive layer 21 is further formed. Again, this conductive layer 21 may, for example, be an impurity-doped polysilicon layer.

Figure 3:
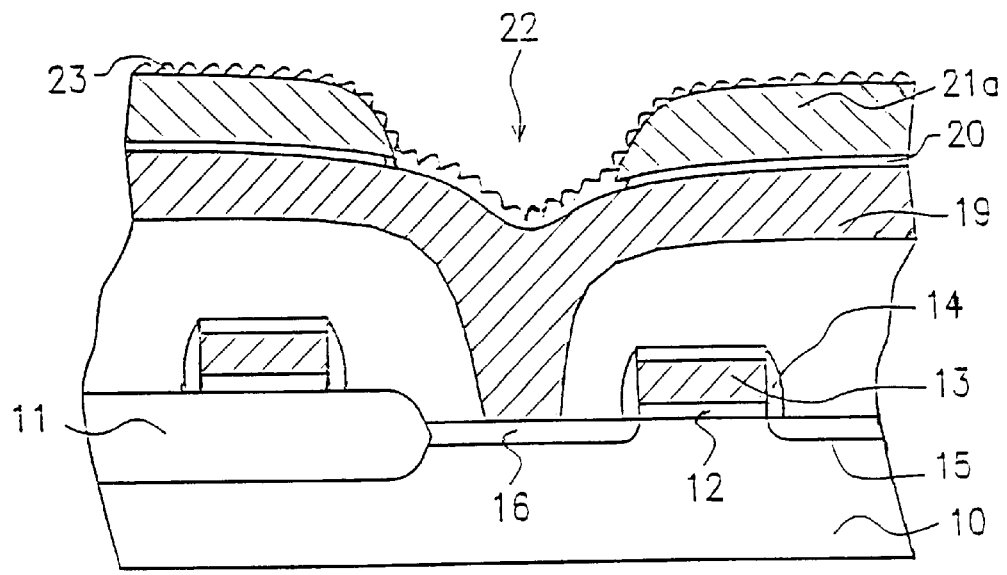

Then, in FIG. 3, the polysilicon layer 21 is patterned in a photolithographic process, forming a recess 22, which is positioned substantially above the location of the contact opening 18 of FIG. 1. The recess 22 may be formed, for example, in a dry etching procedure that etches into the conductive layer 21. The etching is terminated while exposing the native oxide layer 20. During the etching, the exposed native oxide layer 20 must be inherently removed with an appreciable thickness. Moreover, very likely the very thin native oxide layer 20 in the recess 22 will be completely removed simultaneously with the step of patterning the polysilicon layer 21. Thus, when the recess 22 is formed, the top surface of the polysilicon layer 19 will be exposed, forming a device substrate structure as illustrated in FIG. 3, with the conductive layer having a recess 22 now designated by the reference numeral 21a. Then, an HSG—Si layer 23 is formed over the surface of conductive layer 21a, and in the recess 22. The HSG—Si layer 23 can be formed in any of a number of known methods. For example, a LPCVD procedure conducted in an atmospheric environment supplied by a silane gas source and controlled at the temperature in a range of about 550–595° C. may be employed to deposit and form an HSG—Si layer exhibiting irregularity in its layer surface. A thermal diffusion or ion implantation procedure may be employed to drive-in phosphorus ion impurities into the HSG—Si layer 23.

Figure 4:
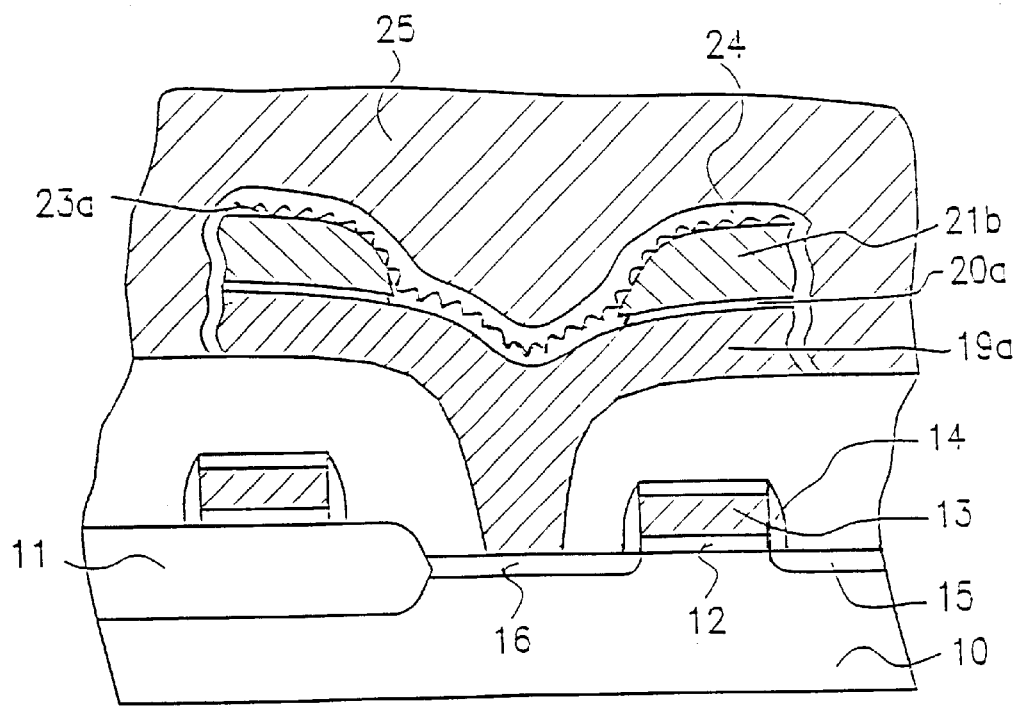

Then, the semiconductor structure of FIG. 3 is patterned in a photolitholraplic procedure to form the bottom electrode for the storage capacitor of the memory cell unit, as is depicted in the cross-sectional view of FIG. 4. This includes etching sequentially into the HSG—Si layer 23, the polysilicon conductive layer 21a, the native oxide layer 20 and the polysilicon conductive layer 19 of FIG. 3. The result is the bottom electrode structure of FIG. 4, including the conductive polysilicon layer 19a, the native oxide layer 20a, the polysilicon conductive layer 21b and the HSG—Si layer 23a. Although the native oxide layer 20a still remains between the first polysilicon layer 19a and the patterned second polysilicon layer 21b, the polysilicon layers 19a and 21b are connected by the HSG layer 23.

The patterned capacitor bottom electrode may now be covered by a layer of dielectric material 24. This dielectric material may, for example, be nitride-oxide (NO), oxide-nitride-oxide (ONO), or tantalum oxide $Ta_2O_5$ that has a higher dielectric constant. After the formation of this dielectric layer 24, another electrically-conductive layer 25 may be formed further covering the bottom electrode enclosed by the dielectric layer 24. This conductive layer 25 may, for example, be phosphorus ion-doped polysilicon. for which the polysilicon may be formed by deposition at a temperature of about 620° C. and having a thickness of about 2,000 Å, and the phosphorus impurities may be doped at a temperature of about 880° C. This conductive polysilicon layer 25 may be used to form the top electrode for the memory cell capacitor.

Thus, the process of the invention makes use of a native oxide layer 20 formed between two conductive polysilicon layers 19 and 21 to serve as the stopping layer of the etching procedure that forms a recess 22 (FIG. 2). Together with the use of HSG—Si layer. such recesses can further increase the surface area of the electrode for the storage capacitor. By utilizing the native oxide layer as the etch-terminating barrier, the depth of the recess can be controlled, which further assists in the control of step coverage, as well as the uniformity and quality of the deposited thin film HSG—Si. Thus, the process of the invention is capable of providing increased electrode surface area for DRAM storage capacitor electrodes.

While the invention has been described by way of example and in terms of the preferred embodiment, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A process for fabricating a DRAM capacitor, comprising:

providing a substrate having at least one transistor formed thereon;

forming an insulation layer on the surface of the substrate, the insulation layer having a contact opening exposing a source/drain region of the transistor;

forming a bottom electrode that extends into the contact opening, said forming a bottom electrode comprising:

forming a first electrically conductive layer covering the insulation layer and filling the contact opening, with the first electrically conductive layer contacting the exposed source/drain region;

naturally forming a native oxide layer on the first electrically conductive layer;

forming a second electrically conductive layer on the native oxide layer, the second electrically conductive layer being patterned to form a recess substantially positioned above the location of the contact opening formed in the insulation layer;

forming a layer of hemispherical-grain polysilicon over the surface of the second electrically conductive layer and the surface of the recess, the layer of hemispherical-grain polysilicon electrically coupling the second electrically conductive layer to the first electrically conductive layer, the hemispherical-grain polysilicon layer, the second electrically conductive layer, the native oxide layer and the first electrically conductive layer being subsequently patterned to form the bottom electrode;

forming a dielectric material layer on the bottom electrode; and forming a top electrode on the dielectric material layer.

2. The process of fabricating a DRAM capacitor, according to claim 1, wherein the recess in the second electrically conductive layer is formed by etching in a photolithographic procedure utilizing the native oxide layer as the stopping layer for etching.

3. The process of fabricating a DRAM capacitor according to claim 2, wherein the step of forming a recess in the second electrically conductive layer is performed by dry etching in the second electrically conductive layer.

4. The process of fabricating a DRAM capacitor according to claim 1, wherein the first electrically conductive layer is doped with impurities.

5. The process of fabricating a DRAM capacitor according to claim 1, wherein the second electrically conductive layer is doped with impurities.

6. The process of fabricating a DRAM capacitor according to claim 1, wherein the hemispherical-grain polysilicon layer is doped with impurities.

7. A process of fabricating a bottom electrode of a DRAM capacitor, comprising:

providing a substrate having at least one transistor formed thereon;

forming an insulation layer on the surface of the substrate, the insulation layer having a contact opening exposing a source/drain region of the transistor;

forming a first electrically conductive layer covering the insulation layer and filling the contact opening, with the first electrically conductive layer contacting the exposed source/drain region;

forming a native oxide layer over the surface of the first electrically conductive layer;

forming a second electrically conductive layer on the native oxide layer;

removing a part of the second electrically conductive layer and a part of the native oxide layer to form a recess substantially located above the location of the contact opening formed in the insulation layer, the recess exposing a part of the first electrically conductive layer; and forming a layer of hemispherical-grain polysilicon on the surface of the second electrically conductive layer and the exposed part of the first electrically conductive layer, wherein the bottom electrode of the capacitor comprises the first electrically conductive layer, the native oxide layer, the second electrically conductive layer, and the hemispherical-grain polysilicon.

8. The method according to claim 7, wherein the first electrically conductive layer is doped with impurities.

9. The method according to claim 7, wherein the second electrically conductive layer is doped with impurities.

* * * * *